United States Patent
Coffy

(10) Patent No.: US 8,754,523 B2
(45) Date of Patent: Jun. 17, 2014

(54) SURFACE-MOUNTED ELECTRONIC COMPONENT

(75) Inventor: Romain Coffy, Saint Martin le Vinoux (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 2 days.

(21) Appl. No.: 13/045,771

(22) Filed: Mar. 11, 2011

(65) Prior Publication Data
US 2011/0227222 A1 Sep. 22, 2011

(30) Foreign Application Priority Data

Mar. 16, 2010 (FR) ...................................... 10 51849
Mar. 7, 2011 (EP) ...................................... 11157223

(51) Int. Cl.
*H01L 23/488* (2006.01)
*H01L 23/00* (2006.01)
*H05K 3/34* (2006.01)
*H01L 23/538* (2006.01)
*H01L 23/498* (2006.01)

(52) U.S. Cl.
CPC .......... *H05K 3/3436* (2013.01); *H01L 2224/97* (2013.01); *H01L 23/49816* (2013.01); *H01L 2924/01006* (2013.01); *H05K 2201/10977* (2013.01); *H01L 24/97* (2013.01); *H01L 2924/01033* (2013.01); *H01L 23/5389* (2013.01); *H01L 24/82* (2013.01)
USPC .......... 257/738; 257/737; 257/693; 257/698; 257/E33.023; 257/E21.477

(58) Field of Classification Search
USPC .......... 257/738, E23.023, E21.477, 737, 693, 257/698, 777, 778
See application file for complete search history.

(56) References Cited

U.S. PATENT DOCUMENTS

| | | | |
|---|---|---|---|
| 5,847,456 A * | 12/1998 | Shoji | 257/737 |
| 6,103,551 A * | 8/2000 | Ono et al. | 438/108 |
| 6,569,753 B1 * | 5/2003 | Akram et al. | 438/612 |
| 6,578,755 B1 * | 6/2003 | Elenius et al. | 228/254 |
| 2005/0199995 A1 * | 9/2005 | Nomoto et al. | 257/692 |
| 2006/0005986 A1 * | 1/2006 | Alcoe | 174/52.1 |
| 2006/0040567 A1 | 2/2006 | Bernier | |
| 2007/0017698 A1 | 1/2007 | Ueno | |
| 2008/0116574 A1 * | 5/2008 | Fan | 257/738 |
| 2009/0045513 A1 | 2/2009 | Kim | |
| 2011/0018114 A1 * | 1/2011 | Pagaila et al. | 257/686 |

OTHER PUBLICATIONS

Shoji et al., Resin-Reinforcement Technology for Enhancing Solder Reliability of D2BGA (Die Dimension BGA), NEC Research and Development, Nippon, Electric Ltd., Tokyo, JP, vol. 40, np. 1, Jan. 1, 1999, pp. 119-124.

* cited by examiner

*Primary Examiner* — Marc Armand
(74) *Attorney, Agent, or Firm* — The Noblitt Group, PLLC

(57) ABSTRACT

A surface-mounted electronic component including balls bonded to its front surface and, on the front surface, a protective resin layer having a thickness smaller than the ball height, wherein grooves extend in the resin layer between balls of the chip.

13 Claims, 2 Drawing Sheets

SURFACE-MOUNTED ELECTRONIC COMPONENT

BACKGROUND OF THE INVENTION

1. Field of the Invention

The present invention relates to surface-mounted electronic components, that is, components having their contact pads supporting conductive protrusions intended to be directly bonded to bonding pads of a support such as a printed circuit board. The present invention more specifically relates to surface-mounted components capable of withstanding shocks and/or temperature variations.

2. Discussion of the Related Art

In surface mounts, to minimize the bulk, bare chips (package-free) having their surfaces only covered with a thin insulating layer, for example, made of silicon oxide, are often used.

FIG. 1A is a cross-section view schematically showing a surface-mountable chip 1 capable of being mounted directly onto the surface of a printed circuit board 3. Chip 1 comprises, on its front surface, metal balls 5 bonded to contact pads (not shown in the drawing) of the chip. Chip 1 is a bare chip only coated with a stack of a thin insulating layer 7 on its front surface (the front surface may also be covered with a stack of several insulating and conductive layers in the case where the balls are connected to the chip via conductive tracks). On its front surface, printed circuit board 3 comprises bonding pads 9. On assembly, balls 5 of the chip bear against bonding pads 9 of the printed circuit. Balls 5 are then bonded to pads 9. The bonding can be, for example, by welding or by any other known bonding technique.

FIG. 1B is a view of the front surface of chip 1, in an example where the chip comprises sixteen contact balls uniformly distributed in a square matrix over the entire chip surface.

In surface mounts, the size of the balls limits the number of electric connections which may be formed between the chip and the printed circuit. As an example, on a square chip having a 4-mm side length, a matrix having at most 8×8 balls with a diameter from 0.25 mm to 0.35 mm and a step from 0.4 mm to 0.5 mm (from center to center) between two neighboring balls is generally provided.

To increase the number of possible connections, it has been provided to form, around the semiconductor chip, a peripheral resin extension, substantially of the same thickness as the chip, this extension being capable of supporting additional contact balls. The resin extension comprises contact pads and conductive tracks at its surface to connect the additional balls to areas of the chip to be contacted.

FIGS. 2A to 2C are cross-section views very schematically showing steps of the forming of thin semiconductor chips provided with peripheral resin extensions.

FIG. 2A illustrates a step during which semiconductor chips 21, previously manufactured and diced according to usual methods, are positioned on a support plate 23. It should be noted that chips 21 will have previously been tested according to usual methods, for example, probe tested, directly on the silicon wafer before chips 21 are diced. Thus, only valid chips 21 are positioned on plate 23, which provides a good manufacturing yield for components provided with peripheral resin extensions. Chips 21 are arranged on plate 23 so that the rear surface of chips 21 remains free. The front surface of chips 21 is for example stuck to support plate 23 via a double coated adhesive. Further, a free space 25 is provided between neighboring chips 21.

FIG. 2B illustrates a step during which a resin deposition is performed on plate 23, so that resin 27 fills free spaces 25 (2A) between chips 21. In practice, to begin with, the thickness of the formed resin layer 27 is greater than the thickness of chips 21. In a subsequent step, resin layer 27 is thinned down to have the same thickness as chips 21. Thus, in top view (not shown), each chip 21 is surrounded with a resin frame 27 solid with the chip, the thickness of resin 27 substantially corresponding to the thickness of chips 21, for example, on the order of from 250 μm to 450 μm.

FIG. 2C illustrates the positioning of contact balls 29 on chips 21 and on the corresponding resin extension 27. In an intermediary step, not shown, the wafer formed by chips 21 and by resin extensions 27 is separated from support plate 23 and may be flipped. Before positioning/bonding balls 29, a stack of insulating and conductive layers capable of forming connections and pads at the surface will have been deposited on the chip and the resin extensions, the connections connecting the pads to contacts on the chip.

In a final step, the extended components are diced.

FIG. 3 is a cross-section view showing in more detailed fashion a component 31 formed according to the method described in relation with FIGS. 2A to 2C. As an example, base semiconductor chip 21 is a square chip with a 4-mm side length, and peripheral resin extensions 27 form, around chip 21, a frame with square sides having a 2-mm width. Thus, chip 21 and resin extension 27 altogether form a square having an 8-mm side length, on which a matrix of 16×16 balls having a diameter from 0.25 mm to 0.35 mm, with a step from 0.4 mm to 0.5 mm between two neighboring balls (from center to center), may be provided.

A problem often encountered in surface mounts is the brittleness of the contact balls. In case of a shock, balls may crack, which will result in malfunctions of the mount. To overcome this disadvantage, it has been provided to partially bury the balls in a protective resin layer formed on the front surface of the chip and having a thickness ranging between 40 and 70% of the ball height. It should be noted that balls 29 are slightly crushed when welded to the connection pads. Thus, balls having a diameter on the order of from 0.25 mm to 0.35 mm (horizontally) will conventionally have a final height on the order of from 0.2 mm to 0.25 mm.

FIG. 4 is a cross-section view showing a component 41 comprising the elements of component 31 of FIG. 3, and further comprising a resin layer 43 for protecting balls 29. Layer 43 is for example formed by resin injection and/or compression on the front surface of the chip, and extends up to approximately 60% of the ball height. In the forming of layer 43, a mold capable of avoiding any resin deposition on the top caps of the balls is generally used, to be able to subsequently form electric contacts on these caps. It should be noted that protective resins usually used are hard and rigid at normal operating temperature of the component. In order to form layer 43, the resin is heated so as to become temporarily malleable.

Resin layer 43 enables to improve the resistance to shocks of contact balls 29. However, the balls remain likely to crack. In particular, balls 29 are embrittled by the mechanical stress which is exerted in a surface mount during temperature variations. Indeed, such a mount comprises different materials having different thermal expansion coefficients (resin 27 of the chip extensions, resin of layer 43, silicon of chip 21, metal of balls 29, printed circuit board support material, etc.). Thus, in temperature variations, the balls are submitted to a significant mechanical stress.

Further, due to the thermal expansion coefficient difference between the substrate of chip 21 and protective resin layer 43, a warpage of the surface mount component is likely to occur. Indeed, when temperature variations occur, the substrate of chip 21 and the resin layer 43 tend to expand or contract by different amounts. The resin 43 and the substrate of chip 21 being rigid materials, with little elasticity or compressibility, this leads to the stack becoming warped.

To minimize this warpage, it has been provided to form, on the rear surface of the chip, a resin layer substantially identical to protection layer 43 formed on the front surface. Thus, in temperature variations, the stress exerted on the chip by layer 43 is compensated by the substantially opposite stress exerted by the rear surface resin layer. However, such a solution requires forming an additional resin layer, which complicates the component manufacturing.

SUMMARY OF THE INVENTION

Thus, a feature of an embodiment of the present invention provides a surface-mounted electronic component at least partly overcoming some of the disadvantages of existing solutions.

Another feature of an embodiment of the present invention provides such a component having a better resistance against shocks and/or temperature variations than existing solutions.

Still another feature of an embodiment of the present invention provides such a component which is easy to manufacture.

Thus, an embodiment of the present invention provides a surface-mounted electronic component comprising balls bonded to its front surface and, on the front surface, a rigid protective resin layer having a thickness smaller than the ball height, wherein grooves extend in the resin layer between balls of the chip.

According to an aspect of an embodiment of the present invention, the grooves extend across the entire area of the resin layer.

According to another aspect of an embodiment of the present invention, groups of juxtaposed balls are surrounded by grooves.

According to another aspect of an embodiment of the present invention, each ball group comprises a single ball.

According to another aspect of an embodiment of the present invention, the resin layer has a thickness ranging between 40% and 70% of the ball height.

According to still another aspect of an embodiment of the present invention, the balls have a diameter ranging from 0.25 mm to 0.35 mm and are spaced apart by a step ranging from 0.4 mm to 0.5 mm, the grooves having a width ranging between 20 μm and 70 μm.

According to another aspect of an embodiment of the present invention, the component further comprises a dicing stop layer between the resin layer and the front surface.

According to another aspect of an embodiment of the present invention, the component further comprises a base semiconductor chip and a peripheral resin extension.

Another embodiment of the present invention provides a method for manufacturing a surface-mounted electronic component comprising the steps of: bonding balls to the front surface of the component; forming a rigid protective resin layer having a thickness smaller than the height of the balls on the front surface of the component; and forming grooves in the resin layer, between balls of the chip.

According to an embodiment of the present invention, the grooves are formed with a saw or with a saw and a laser.

The foregoing synopsis, aspects and features of the present invention will be discussed in detail in the following non-limiting description of specific embodiments in connection with the accompanying drawings.

DETAILED DESCRIPTION

Figure 1A:
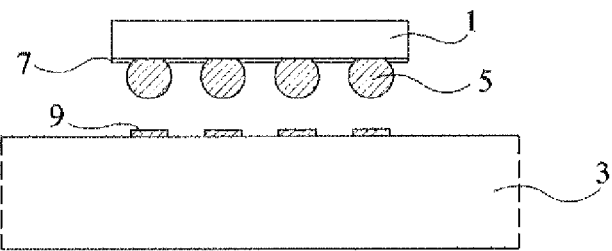
FIG. 1A, previously described, is a cross-section view schematically showing a surface-mountable chip and a printed circuit capable of receiving this chip.
Figure 1B:
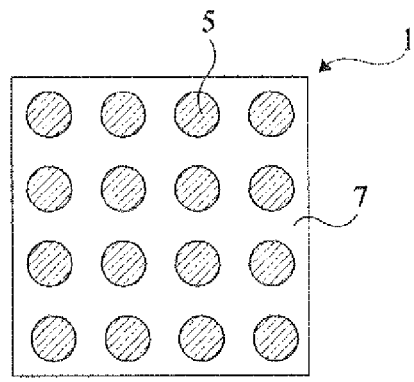
FIG. 1B, previously-described, is a view of the front surface of the chip of FIG. 1.

For clarity, the same elements have been designated with the same reference numerals in the different drawings and, further, as usual in the representation of electronic components, the various drawings are not to scale.

Figure 5A:
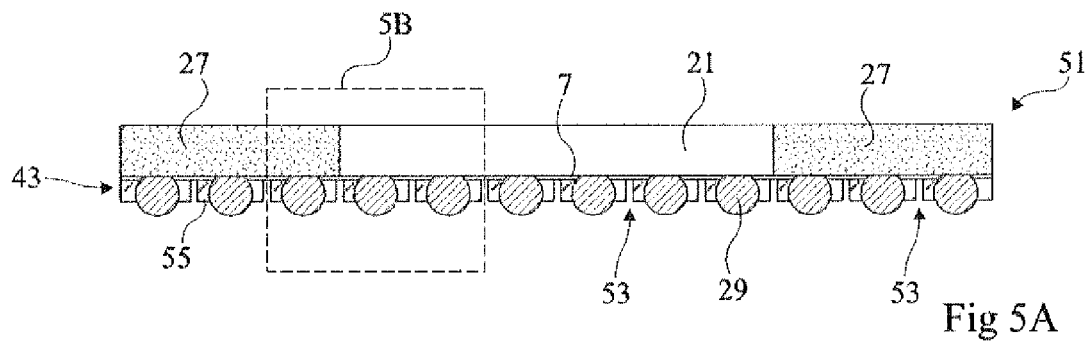
FIG. 5A is a cross-section view schematically showing an embodiment of a surface-mountable chip having an improved resistance to shocks and/or to temperature variations.
Figure 5B:
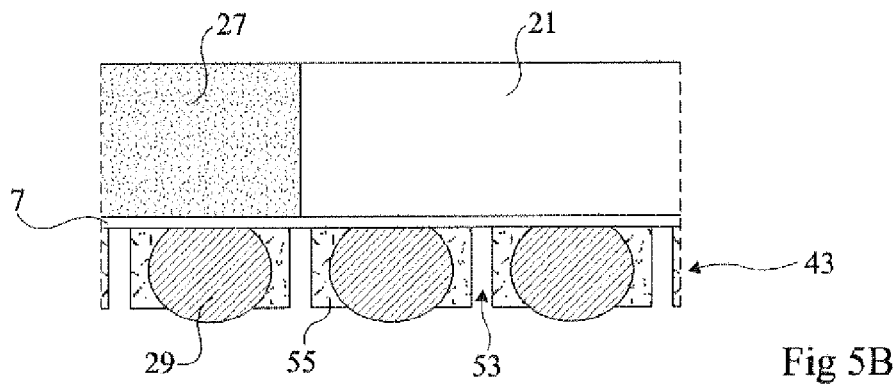
FIG. 5B is a cross-section view showing in further detail a portion of the chip of FIG. 5A.
Figure 5C:
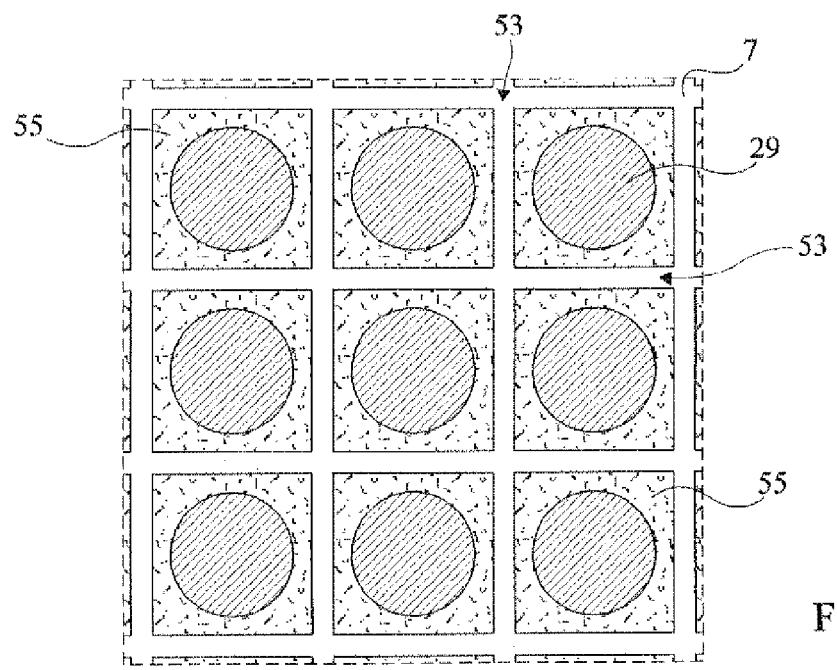
FIG. 5C is a view of the front surface of the chip portion of FIG. 5B.

FIG. 5A is a cross-section view schematically showing an example of an embodiment of a surface-mountable chip 51 having an improved resistance to shocks and/or to temperature variations. FIG. 5B is an enlargement of a portion of the cross-section view of FIG. 5A. FIG. 5C is a view of the front surface of the portion of chip 51 of FIG. 5B. Reference will be made hereafter to these three drawings together.

Figure 2A:
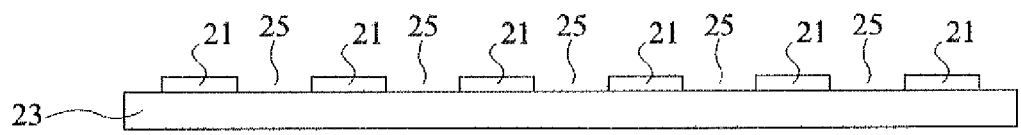
FIGS. 2A to 2C, previously described, are cross-section views very schematically showing steps of the forming of surface-mounted chips provided with peripheral resin extensions.
Figure 2B:
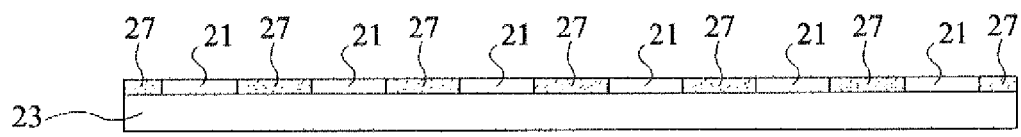
Figure 2C:
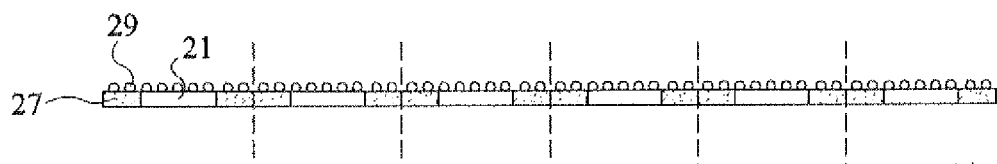
Figure 3:
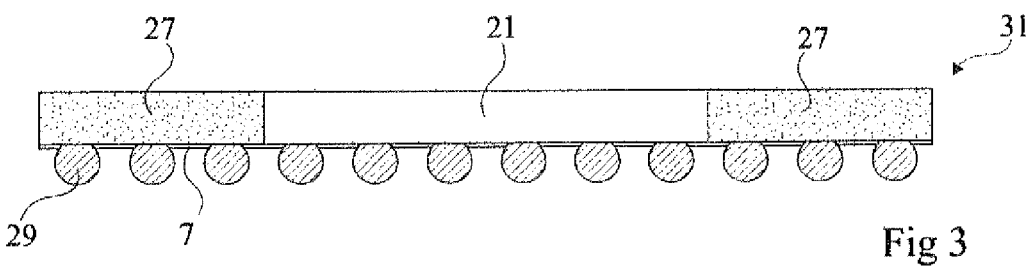
FIG. 3, previously described, is a cross-section view showing in further detail an extended chip formed according to the method described in relation with FIGS. 2A to 2C.
Figure 4:
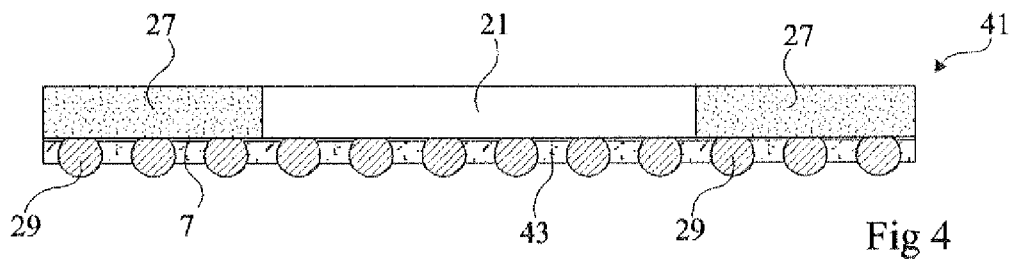
FIG. 4, previously described, is a cross-section view showing a chip of the type described in relation with FIG. 3, further comprising a resin layer for protecting the chip contact balls.

Like chip 41 of FIG. 4, chip 51 is a chip provided with peripheral resin extensions, formed according to a method of the type described in relation with FIGS. 2A to 2C. Chip 51 is formed of a base semiconductor chip 21, for example, having a thickness on the order of from 250 μm to 450 μm, comprising a peripheral resin extension 27, substantially of same thickness. Contact balls 29 are bonded to contact pads formed on chip 21 and on resin extension 27. Connection metallizations, not shown, connect these pads to areas of the chip to be contacted.

Balls 29 are partially buried in a protective resin layer 43, formed on the front surface of the chip, and extending across a substantially uniform thickness, smaller than the ball height. Resin 43 is a rigid resin, of the type usually used as a protection or encapsulation layer in the field of semiconductor components. According to a preferred embodiment, the thickness of layer 43 ranges between 40% and 70% of the ball height. As an example, the ball height is on the order of from 0.2 mm to 0.25 mm, and the thickness of resin layer 43 is on the order of from 0.1 mm to 0.2 mm.

Grooves 53 form a grid on resin layer 43 between balls 29, delimiting a matrix of resin islands 55, each island 55 containing a ball 29. In practice, each island occupies a substantially cubic volume, and contains a ball 29 forming a projection on the upper side of the island. According to a preferred embodiment, illustrated in FIGS. 5A to 5C, grooves 53 extend in depth all the way to insulating layer 7 forming the front surface of the chip. However, the present invention is not limited to this specific case, and the grooves may also stop slightly before insulating layer 7.

Grooves 53 are formed by any adapted means. Usual semiconductor chip dicing tools, for example, a saw or a laser, will preferably be used. It may also be chosen to form a pre-notch with the saw, and to end the groove forming by means of a laser. Optionally, a laser stop layer may be provided between resin layer 43 and insulating layer 7. As an example, and for the above-indicated ball dimensions, the groove width ranges between 20 µm and 70 µm.

A benefit of the provided structure is that the provision of grooves enables to decrease the mechanical stress exerted on the structure, especially the stress linked to differences in thermal expansion coefficients between the different materials in a surface-mounted. Indeed, the provision of grooves enables to leave a freedom of motion to the balls.

In particular, the provision of grooves enables to avoid surface-mounted component warpage phenomena due to the difference in thermal expansion coefficients between the resin of layer 43 and the chip substrate (for example, silicon). Thus, it is no longer necessary to provide an additional resin layer on the rear surface side of the chip to compensate for this warpage phenomenon.

Another benefit of the provided structure is that grooves 53 are easy to form, especially by using usual dicing tools.

Specific embodiments of the present invention have been described. Various alterations, modifications, and improvements will occur to those skilled in the art.

In particular, the present invention is not limited to the specific case described in relation with FIGS. 5A to 5C, where the surface-mounted component is an extended chip comprising a peripheral resin extension. It will especially be within the abilities of those skilled in the art to implement the desired operation in the case where the surface-mounted component is a conventional semiconductor chip comprising no resin extension.

Further, the dimensions mentioned in the present description are given as an example only. The present invention is not limited to these specific cases.

Further, an embodiment in which each ball of the chip is surrounded by grooves 53 has been mentioned hereabove. The present invention is not limited to this specific case. It may be provided to form grooves 53 around groups of juxtaposed balls, for example, balls arranged as a square or a rectangle.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic component adapted for mounting on the surface of a printed circuit board and having a front surface comprising:
    balls bonded to said front surface; and
    a rigid protective resin layer, on said front surface, having a thickness smaller than the ball height, wherein grooves extend in the resin layer between said balls, and wherein the rigid protective resin layer comprises a resin that is rigid at a normal operating temperature of the electronic component and that becomes malleable when heated.

2. The component of claim 1, wherein the grooves extend across the entire area of the resin layer.

3. The component of claim 1, wherein groups of multiple balls are surrounded by grooves.

4. The component of claim 1, wherein each of said balls is surrounded by grooves.

5. The component of claim 1, wherein the protective resin layer has a thickness ranging between 40% and 70% of the ball height.

6. The component of claim 1, wherein the balls have a diameter ranging from 0.25 mm to 0.35 mm and are spaced apart by a step ranging from 0.4 mm to 0.5 mm, the grooves having a width ranging between 20 µm and 70 µm.

7. The component of claim 1, further comprising a dicing stop layer between the resin layer and the front surface.

8. The component of claim 1, further comprising a base semiconductor chip and a peripheral resin extension.

9. A method for manufacturing a surface-mounted electronic component comprising the steps of:
    bonding balls to a front surface of the component;
    forming a rigid protective resin layer having a thickness smaller than the height of the balls on the front surface of the component; and
    forming grooves in the resin layer, between the balls.

10. The method of claim 9, wherein the grooves are formed with a saw.

11. The method of claim 9, wherein the grooves are formed with a saw and a laser.

12. The method of claim 9, wherein the grooves are formed with a laser.

13. A method for manufacturing a surface-mounted electronic component comprising the steps of:
    bonding balls to a front surface of the component; and
    forming a protective resin layer having a thickness smaller than the height of the balls on the front surface of the component, wherein the protective resin layer comprises a resin that is rigid at a normal operating temperature of the electronic component and that becomes malleable when heated; thereby
    forming grooves in the resin layer, between the balls.

* * * * *